(12) United States Patent
Quaglio et al.

(10) Patent No.: US 10,534,255 B2
(45) Date of Patent: Jan. 14, 2020

(54) METHOD OF APPLYING VERTEX BASED CORRECTIONS TO A SEMICONDUCTOR DESIGN

(71) Applicant: ASELTA NANOGRAPHICS, Grenoble (FR)

(72) Inventors: Thomas Quaglio, Grenoble (FR); Mathieu Millequant, Grenoble (FR); Charles Tiphine, Echirolles (FR)

(73) Assignee: ASELTA NANOGRAPHICS, Grenoble (FR)

( * ) Notice: Subject to any disclaimer, the term of this patent is extended or adjusted under 35 U.S.C. 154(b) by 61 days.

(21) Appl. No.: 15/534,921

(22) PCT Filed: Dec. 22, 2015

(86) PCT No.: PCT/EP2015/081059
§ 371 (c)(1),
(2) Date: Jun. 9, 2017

(87) PCT Pub. No.: WO2016/102607
PCT Pub. Date: Jun. 30, 2016

(65) Prior Publication Data
US 2018/0267399 A1    Sep. 20, 2018

(30) Foreign Application Priority Data

Dec. 23, 2014 (EP) .................... 14307169

(51) Int. Cl.
*G03F 1/78* (2012.01)
*G03F 1/36* (2012.01)
(Continued)

(52) U.S. Cl.
CPC .............. *G03F 1/36* (2013.01); *G03F 1/20* (2013.01); *G03F 7/705* (2013.01);
(Continued)

(58) Field of Classification Search
CPC ............. G06F 17/5045; G06F 17/5081; G06F 17/5009; G06F 2217/02; G06F 2217/12;
(Continued)

(56) References Cited

U.S. PATENT DOCUMENTS 5,475,766 A * 12/1995 Tsuchiya ............ G01N 21/8851
345/441
6,453,457 B1 * 9/2002 Pierrat ...................... G03F 1/36
430/5
(Continued)

FOREIGN PATENT DOCUMENTS

FR   3 005 170 A1   10/2014
JP   2004-301892 A  10/2004
(Continued)

OTHER PUBLICATIONS

Clyde Browning et al., "Photonic curvilinear data processing," Proceedings of SPIE-International Society for Optical Engineering, vol. 9235, Oct. 15, 2014, pp. 1-10, XP060041923.
(Continued)

*Primary Examiner* — Helen Rossoshek
(74) *Attorney, Agent, or Firm* — Baker & Hostetler LLP

(57) ABSTRACT

A method of geometry corrections to properly transfer semiconductor designs on a wafer or a mask in nanometer scale processes is provided. In contrast with some prior art techniques, geometry corrections and possibly dose corrections are applied before fracturing. Unlike edge based corrections, where the edges are displaced in parallel, the displacements applied to generated geometry corrections do not preserve parallelism of the edges, which is specifically well suited for free form designs. A seed design is generated from the target design. Vertices connecting segments are placed along the seed design contour. Correction sites are placed on the segments. Displacement vectors are applied to the vertices. A simulated contour is generated and compared
(Continued)

to the contour of the target design. The process is iterated until a match criteria between simulated and target design (or another stop criteria) is reached.

15 Claims, 8 Drawing Sheets

(51) Int. Cl.
    *G03F 1/20*            (2012.01)
    *G03F 7/20*            (2006.01)
    *G06F 17/50*          (2006.01)

(52) U.S. Cl.
    CPC ...... *G03F 7/70508* (2013.01); *G03F 7/70616* (2013.01); *G06F 17/5068* (2013.01); *G06F 17/5081* (2013.01)

(58) Field of Classification Search
    CPC .. G06F 11/36; G06F 17/5027; G03F 7/70625; G03F 7/70633; G03F 7/70683; G03F 1/20; G03F 1/44; G03F 1/78; G03F 7/705; G03F 7/70508; G03F 7/70616
    See application file for complete search history.

(56) References Cited

U.S. PATENT DOCUMENTS

| | | | | |
|---|---|---|---|---|
| 6,686,953 | B1* | 2/2004 | Holmes | H04N 1/6033 348/179 |
| 6,848,088 | B1* | 1/2005 | Levitt | G06F 17/504 716/106 |
| 7,260,812 | B2* | 8/2007 | Melvin, III | G03F 1/36 430/5 |
| 7,318,205 | B2* | 1/2008 | Levitt | G06F 17/504 716/106 |
| 7,784,019 | B1* | 8/2010 | Zach | G06F 17/5068 716/123 |
| 7,873,504 | B1* | 1/2011 | Bevis | G03F 1/36 356/252 |
| 7,904,848 | B2* | 3/2011 | Coene | G06F 9/5066 716/111 |
| 7,925,486 | B2* | 4/2011 | Smith | G03F 1/44 356/252 |
| 7,953,582 | B2* | 5/2011 | Hara | G03F 1/36 703/6 |
| 8,392,871 | B2* | 3/2013 | Mansfield | G03F 7/203 716/119 |
| 8,584,075 | B2* | 11/2013 | Datta | G06F 17/5081 716/101 |
| 8,984,451 | B2* | 3/2015 | Tiphine | H01J 37/3026 716/53 |
| 9,922,159 | B2* | 3/2018 | Tiphine | H01J 37/3026 |
| 9,990,455 | B1* | 6/2018 | Sinivaara | G06F 17/5081 |
| 10,055,530 | B1* | 8/2018 | Sinivaara | G06F 17/5072 |
| 10,157,728 | B2* | 12/2018 | Tiphine | H01J 37/3026 |
| 2007/0276634 | A1* | 11/2007 | Smith | G06F 17/5009 703/1 |
| 2008/0201684 | A1 | 8/2008 | Krasnoperova | |
| 2010/0202654 | A1* | 8/2010 | Matsuoka | G03F 7/70616 382/100 |
| 2011/0116067 | A1* | 5/2011 | Ye | G03F 7/70091 355/67 |
| 2011/0159434 | A1 | 6/2011 | Zable et al. | |
| 2013/0170757 | A1* | 7/2013 | Shinoda | G06K 9/00 382/209 |
| 2014/0013286 | A1 | 1/2014 | Hsuan et al. | |
| 2015/0286374 | A1* | 10/2015 | Dibble | G06F 17/30 715/762 |
| 2015/0356230 | A1* | 12/2015 | Banerjee | G06F 17/5081 716/53 |
| 2016/0196379 | A1* | 7/2016 | Adel | G03F 1/36 716/52 |

FOREIGN PATENT DOCUMENTS

| | | |
|---|---|---|
| JP | 2009-70880 A | 4/2009 |
| WO | 2011/128393 A1 | 10/2011 |
| WO | 2014/127850 A1 | 8/2014 |
| WO | 2014/177776 A1 | 11/2014 |

OTHER PUBLICATIONS

English Translation of Notification of Provisional Rejection issued in Korean Patent Application No. 10-2017-7017435 dated Nov. 8, 2018.

English Translation of Japanese Notice of Rejection issued in Japan Patent Application No. 2017-533835 dated May 29, 2018.

\* cited by examiner

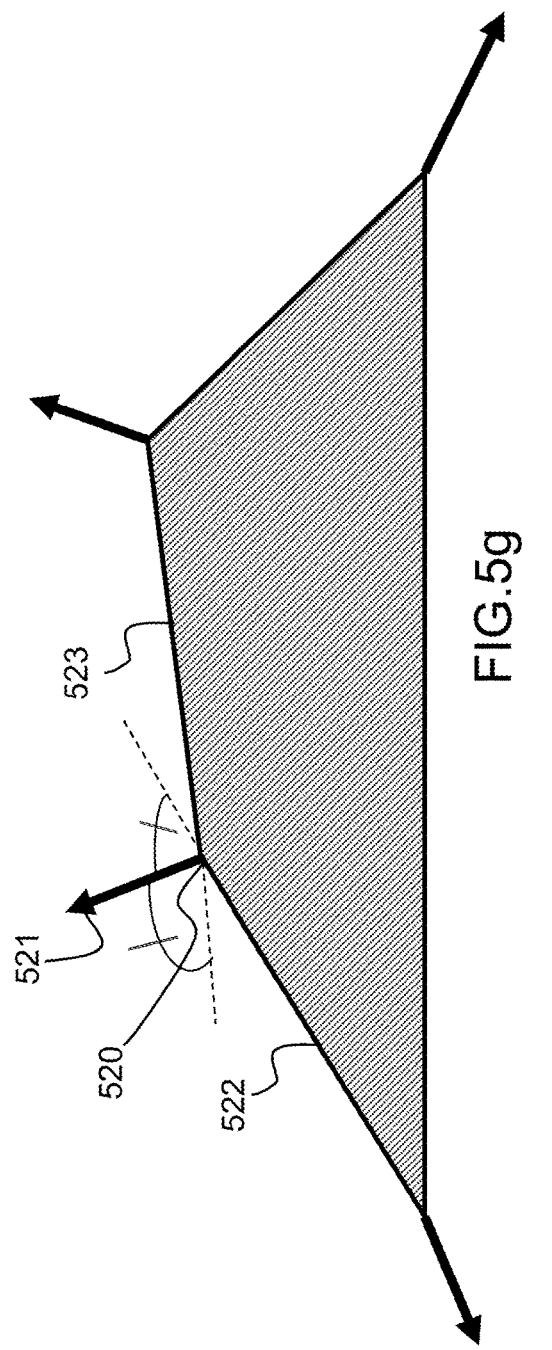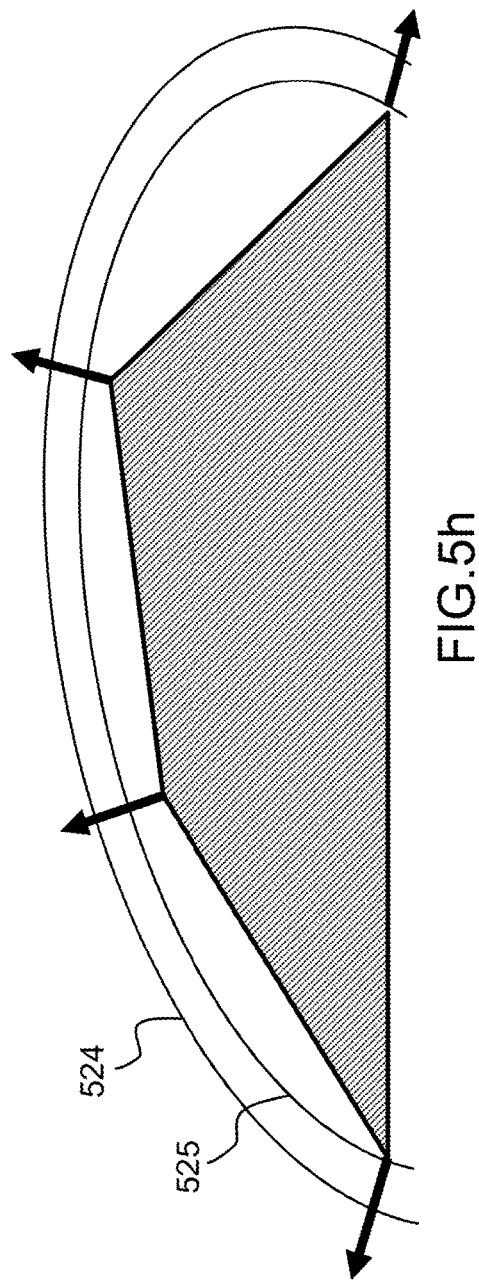

METHOD OF APPLYING VERTEX BASED CORRECTIONS TO A SEMICONDUCTOR DESIGN

CROSS-REFERENCE TO RELATED APPLICATIONS

This application is a National Stage of International patent application PCT/EP2015/081059, filed on Dec. 22, 2015, which claims priority to foreign European patent application No. EP 14307169.4, filed on Dec. 23, 2014, the disclosures of which are incorporated by reference in their entirety.

FIELD OF THE INVENTION

The present invention notably applies to the field of electronic or optical lithography of masks for transferring designs on to a substrate. It also applies to processes whereby an electron beam is used to directly write a pattern on a substrate or mask.

BACKGROUND

One way of transferring a pattern on to a surface by e-beam lithography is to use a variable shaped beam or VSB to reveal a positive or negative resist coating. For doing so, during a fracturing step, the pattern is to be cut into elementary forms to which a radiation dose is assigned (known as "shots"). Geometry and radiation dose of the shots are closely interrelated because, at the dimensions which are now used (technologies with a critical dimension or "CD" of less than 25 nm), the proximity effects (forward scattering and backward scattering) largely depend on the density of the exposed area.

The patterns to be transferred are quite often of a simple geometric form, such as thin rectangles (lines) or squares (interconnections). These patterns are often named "Manhattan patterns" in the art. Under these circumstances, the geometry of the shots is defined accordingly and is also simple: each pattern is fractured into a union of rectangular or square shots. Nevertheless, for a number of applications (inverse lithography, photonics, metrology calibration, etc.), it may be necessary or advantageous to include in the design patterns which are not simple forms of the type previously described, but which may be circles or of an indeterminate, possibly curvilinear, form (further referred to as free-form).

It is known in the art to apply geometry and/or dose corrections to the shots to obtain an insulated or developed set of patterns which is the closest possible to the target design. For instance, a combined optimization of the shot size and their dose is disclosed by European Patent application published under n°EP2559054. In the case of free form patterns, paving by shots with a circular or quasi-circular imprint of varying size is disclosed by PCT application filed under n°PCT/EP2013/053883 which is assigned to the applicant of this application.

It is also known to apply corrections before fracturing. For instance, edge based corrections may be calculated by comparing a simulated contour and a target contour and implemented by applying iteratively edge displacement vectors to the simulated contour until a matching criteria is reached. Such a technique is disclosed by the PCT application published under n°WO2014/177776 which is also assigned to the applicant of this application. For Manhattan type design edge based corrections improve on shot based corrections because they create far less artefacts, like overlaps, holes, lonely thin shots, edges which cannot be moved, etc.). But in the case of free-form patterns, edge based corrections are far less efficient because, notably, they allow less control of the impact of the corrections on the simulated contour.

It would be advantageous to find a novel technique which brings the benefits of edge based corrections without its drawbacks.

SUMMARY OF THE INVENTION

The invention overcomes these problems of the prior art, by including at least a vertex based correction step in a correction method using a comparison between a simulated contour and a target contour.

To this effect, the invention discloses a method of generating, with a computer, data for use in a fracturing of a target design for insulating a semiconductor integrated circuit, said method being characterized in that it comprises:
  a) Generating a seed design from the target design;
  b) Generating segments connecting vertices of the seed design to form a contour of the seed design;
  c) Placing a number of correction sites on the contour of the seed design;
  d) Associating the correction sites and the vertices;
  e) Associating a dose map with the simulated design;
  f) Generating a simulated contour of the seed design at the correction sites to form a simulated design;
  g) Displacing at least part of the vertices to improve a matching criteria between the simulated contour and the contour of the seed design;
  h) Redoing steps e) through g) until a stop criteria is met.

Advantageously, the rectilinear segments are defined to have a length comprised between a minimum value and a maximum value.

Advantageously, the minimum value is higher than or equal to the value of a forward scattering parameter of the insulating process.

Advantageously, the maximum value is lower than or equal to the value of a backward scattering parameter of the insulating process.

Advantageously, the correction sites are placed based on a placement rule selected from a group comprising placing correction sites on selected edges of the simulated contour, placing correction sites at selected vertices and placing correction sites one of behind and in front of selected vertices.

Advantageously, the groups of vertices are associated with correction sites based on an association rule selected from a group comprising associating a group of vertices with a closest correction site, associating a group of vertices with a correction site within a predefined distance, associating a group of vertices with a correction site within a predefined weighted distance calculated with a weight depending on a distance between vertex and correction site.

Advantageously, displacing vertices is determined based on a displacement rule selected in a group comprising displacing a vertex along a bisector of an angle between two segments apart the vertex and displacing a vertex along a dose gradient at the vertex.

Advantageously, displacing vertices is determined based on a difference between the simulated design and the target design at the correction sites.

Advantageously, associating a dose map to the simulated design comprises determining dose corrections to update the dose map at each iteration.

Advantageously, the dose corrections are long range.

Advantageously, the method of the invention further comprises, after step h), i) Manhattanizing the simulated design.

Advantageously, the method of the invention further comprises, after one of steps h) and i), j) performing an edge based correction.

Advantageously, the method of the invention further comprises, after one of steps h), i), and j), k) performing a fracturing of the output contour Advantageously, the method of the invention further comprises, after one of steps h), i), j) and k), l) performing a combined dose and geometry correction.

The invention also discloses a computer program for generating data for use in a fracturing of a target design for insulating a semiconductor integrated circuit, said computer program being characterized in that it comprises user interfaces, computer code instructions and access to computer and memory resources configured for:
 a) Generating a seed design from the target design;
 b) Generating rectilinear segments connecting vertices of the seed design to form a contour of the seed design;
 c) Placing a number of correction sites on the contour of the seed design;
 d) Associating the correction sites and the vertices;
 e) Associating a dose map with the simulated design;
 f) Generating a simulated contour of the seed design at the correction sites to form a simulated design;
 g) Displacing at least part of the vertices to improve a matching criteria between the simulated contour and the contour of the seed design;
 h) Redoing steps e) through g) until a stop criteria is met.

The invention also discloses a semiconductor manufacturing equipment configured to use at least an output of a computer program according to the invention, said semiconductor manufacturing equipment configured for one of direct writing on semiconductor wafers and writing on a mask plate, using one of Gaussian electronic beam lithography, multi-beam electronic lithography and laser lithography.

The invention brings numerous additional advantages. Notably, in a vertex based correction step, the maximum of simulation distortion when moving a vertex is near the vertex. Also, it is possible to limit the number of edges which are created when placing the vertices according to the invention, whereas when using an edge based correction on a free-form design, it is difficult to control the distortion without increasing artificially the number of edges. If the free-form is very complex, the number of edges will have to be far too high. In addition, the displacement of the contour resulting from vertex displacements calculated according to the invention will be continuous, which is not the case for edge based corrections.

BRIEF DESCRIPTION OF THE DRAWINGS

The invention will be better understood and its various features and advantages will become apparent from the description of various embodiments and of the following appended figures:

FIGS. 5a, 5b, 5c, 5d, 5g, 5e, 5f, 5g and 5h illustrate examples of rules applied to determine the correction site placement and association with the vertices in a number of embodiments of the invention.

DETAILED DESCRIPTION

Figure 1A:
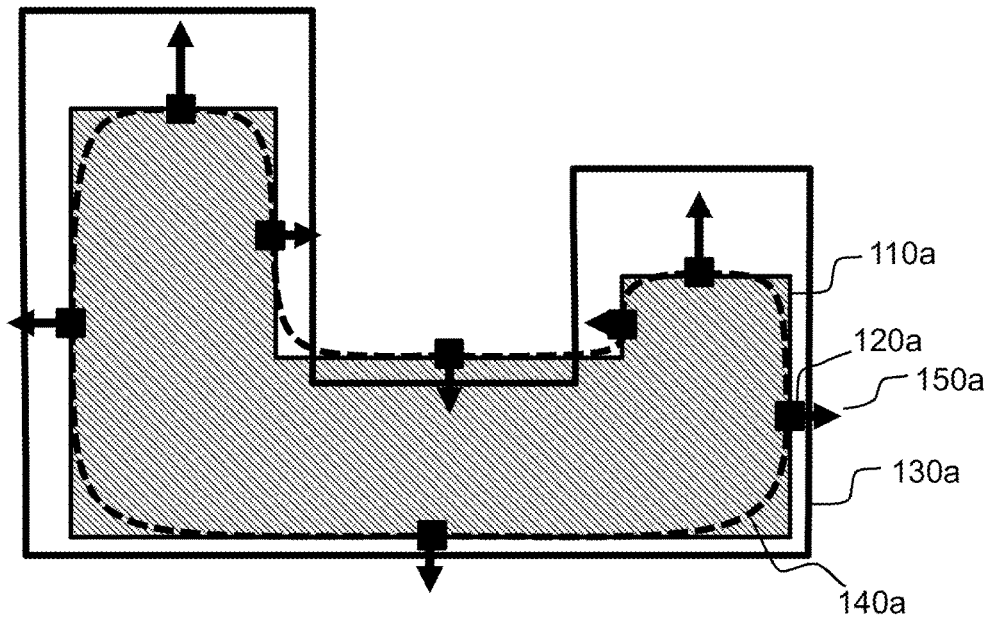
FIGS. 1a and 1b respectively represent a design with Manhattan patterns and a design with free-form patterns which are both corrected using an edge based correction process of the prior art.
Figure 1B:
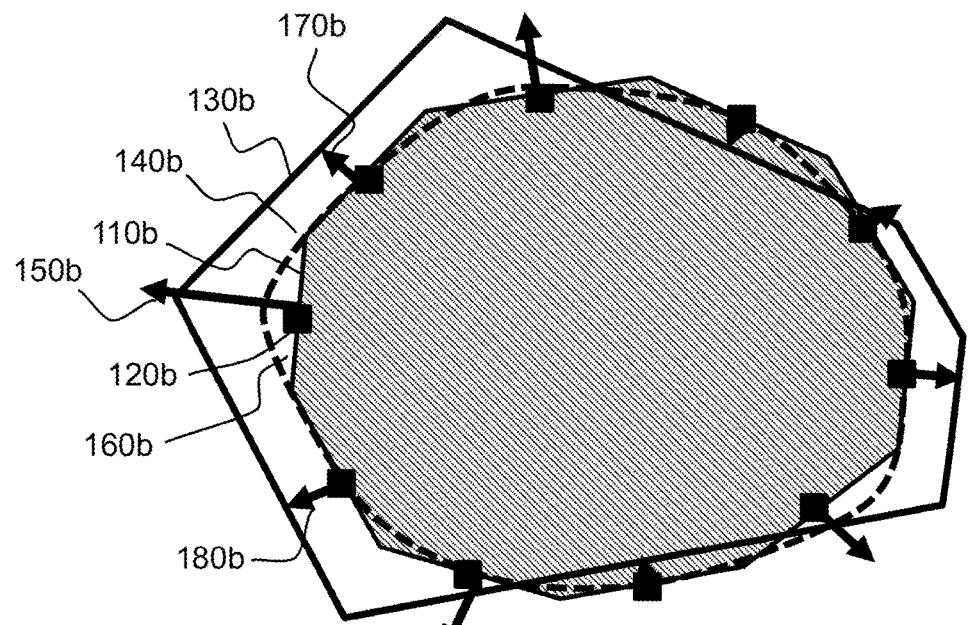

FIGS. 1a and 1b respectively represent a design with Manhattan patterns and a design with free-form patterns which are both corrected using an edge based correction process of the prior art.

A simplified model of an edge based correction process is represented on FIG. 1a applied to a Manhattan target edge 110a. A simulation or correction site 120a is selected preferably at the middle point of the target edge. A displacement vector 150a is calculated to move the edge with the simulation site in the direction of the output contour 130a. The position of the simulation of the output 140a is then compared to the target edge 110a. The process is iterative: it is stopped when the distance between the simulation of the output and the target is lower than a threshold.

In the present application, the following terms are defined as follows, using the vocabulary of Inverse Lithography Transform (ILT). In ILT:
 A target is the design which should be printed on the surface;
 An output contour of the ILT is the result of the inverse transformation using the target as an input;
 A simulation of the output is the result of the direct transformation using the output contour as an input. It should match the target as much as possible.

The process works well for Manhattan designs because the maximum of modification due to the displacement is at the simulation site and therefore easy to control.

On FIG. 1b, the target is a free form. A simulation site 120b is selected at the middle of a target edge 110b, and the same process of edge based is applied, using the output contour 130b, the simulation of the output 140b and the displacement vector 150b. But, in this case, the displacement of the two neighbor edges 170b and 180b will remove the edge initially between them. It will generate a modification of the simulation result which will be maximal where these two edges meet. The error 160b will not be easy to control and correct through iterations. This drawback is overcome with the method of the invention.

Figure 2A:
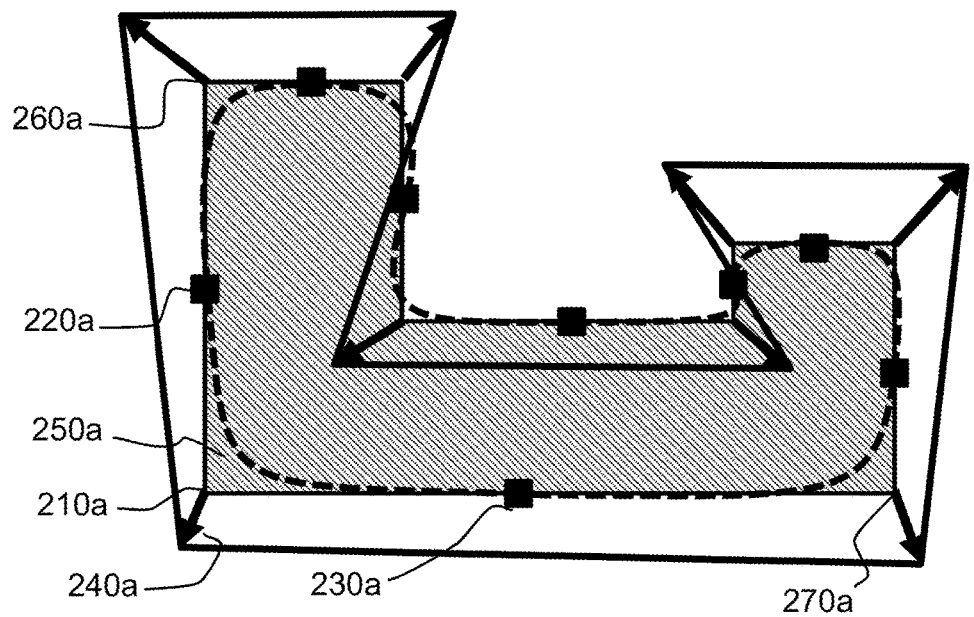
FIGS. 2a and 2b respectively represent a design with Manhattan patterns and a design with free-form patterns which are both corrected using a vertex based correction process according to a number of embodiments of the invention.
Figure 2B:
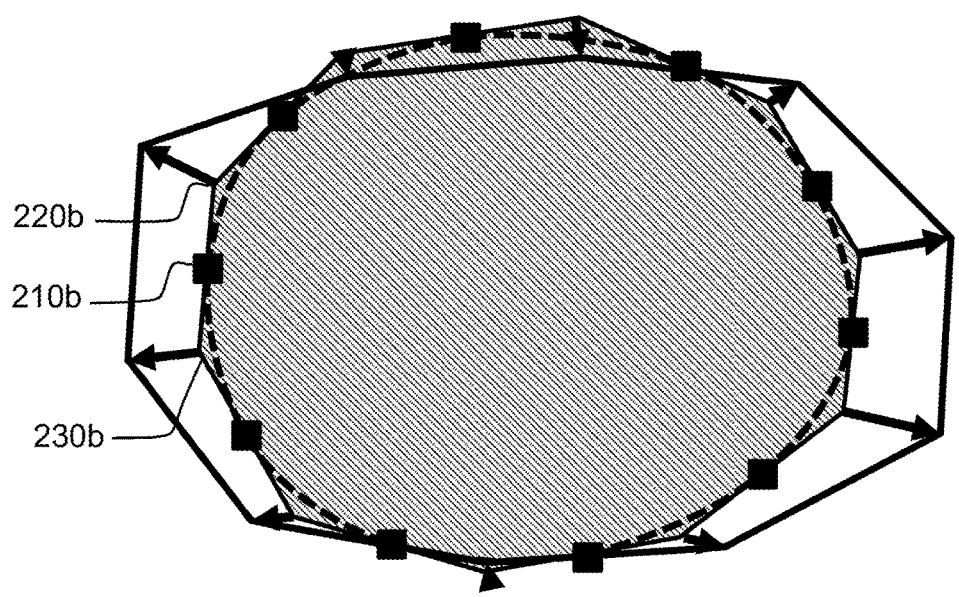

FIGS. 2a and 2b respectively represent a design with Manhattan patterns and a design with free-form patterns which are both corrected using a vertex based correction process according to a number of embodiments of the invention.

In a correction method according to the invention, in contrast to the prior art edge based correction method, the displacement vectors are not applied at the simulation or correction sites, but at some or all of the vertices of the design.

FIG. 2a represents the same design with Manhattan patterns as the one of FIG. 1a. A method, the different steps of which will be explained further down in the description, is applied. We choose a vertex 210a on the target design. It is located between two correction sites 220a and 230a which are located on the two edges apart of the vertex. We also use the output contour and the iteration of the adjustment of the simulation of the output to the target design to generate a series of displacement vectors 240a until the fit is better than a predetermined level. In the example of the figure, an error 250a is generated by the independent displacements of the two vertices 260a and 270a which are located on each side of vertex 210a. Because of the independent displacement of the vertices, parallelism of the edges is not preserved, which is not optimum for Manhattan design. It will not be easy to eliminate this error automatically.

FIG. 2b represents the same free form design as the one of FIG. 1b. According to the method of the invention, the independent displacements of vertices 220b and 230b allow control of the displacement of the edge 210b. Therefore, the error which occurs at the same site of the same design when applying an edge based correction does not occur when applying the vertex based correction of the invention.

Figure 3A:
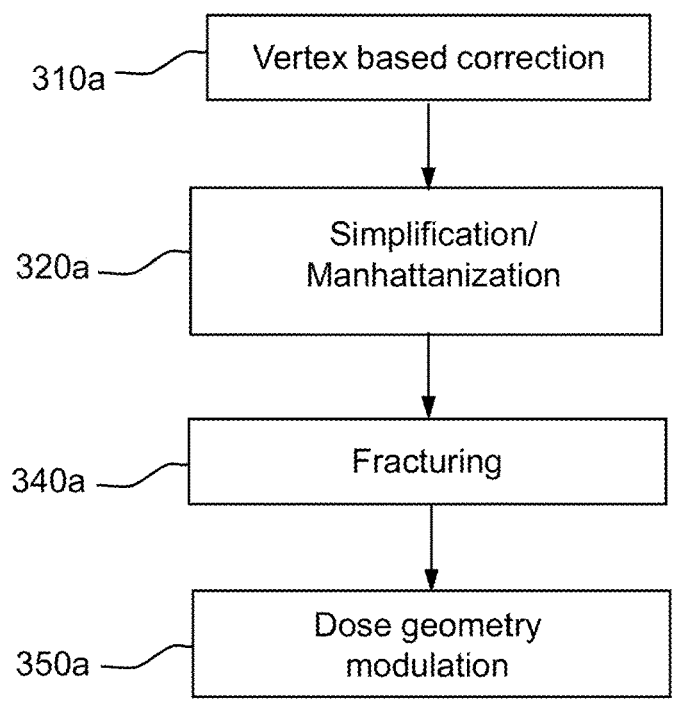
FIGS. 3a and 3b represent two flow charts of variants of a process including a vertex based correction step according to a number of embodiments of the invention.
Figure 3B:
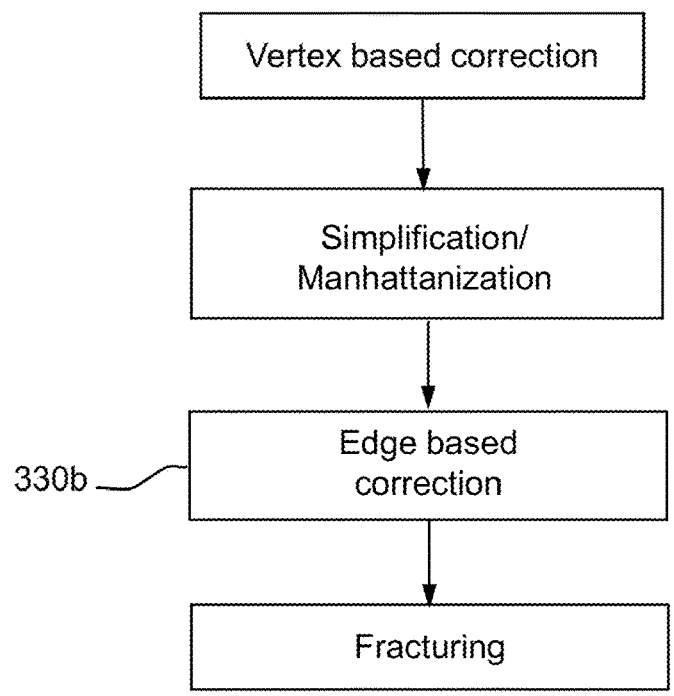

FIGS. 3a and 3b represent two flow charts of variants of a process including a vertex based correction step according to a number of embodiments of the invention.

The vertex based correction of the invention may be included in different processing flows. It is important to note that both vertex based correction and edge based correction are geometry corrections which are applied before fracturing the design in elementary shots. Applying geometry corrections before fracturing has the advantage of generating less artefacts (overlaps, holes, isolated thin shots, edges which cannot be moved, etc.). Before fracturing a free form design, it is generally also advantageous to generate simple Manhattan subparts.

In the embodiment of FIG. 3a, the result of vertex based correction step 310a is first submitted to a step 320a of simplification/Manhattanisation. After fracturing step 340a, a combined dose/geometry modulation or DMG step 350a may be performed when useful. DMG can be performed using the method disclosed in European patent application published under n°EP2559054 which is licensed to the applicant of the present application.

In the variant of FIG. 3b, a step of edge based correction 330b is performed between Manhattanisation and fracturing. In this process flow, the vertex based corrections are used to adjust the contour, which may necessitate significant displacements, whereas the edge based corrections are used to fine tune the Manhattan shapes to the target, which will normally need small displacements.

Figure 4A:
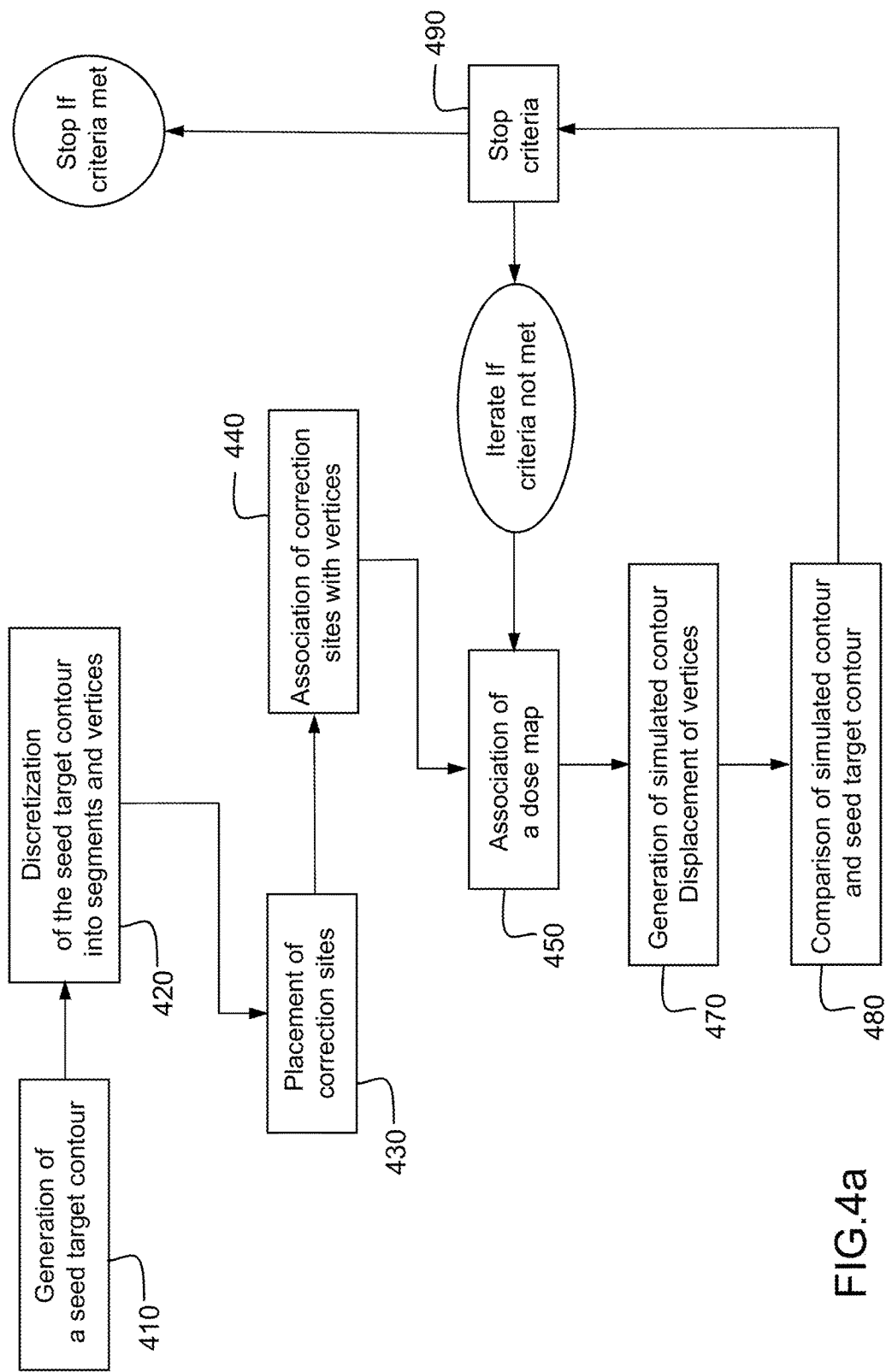
FIGS. 4a and 4b respectively represent flow charts of a vertex based correction step without and with a dose correction in a number of embodiments of the invention.
Figure 4B:
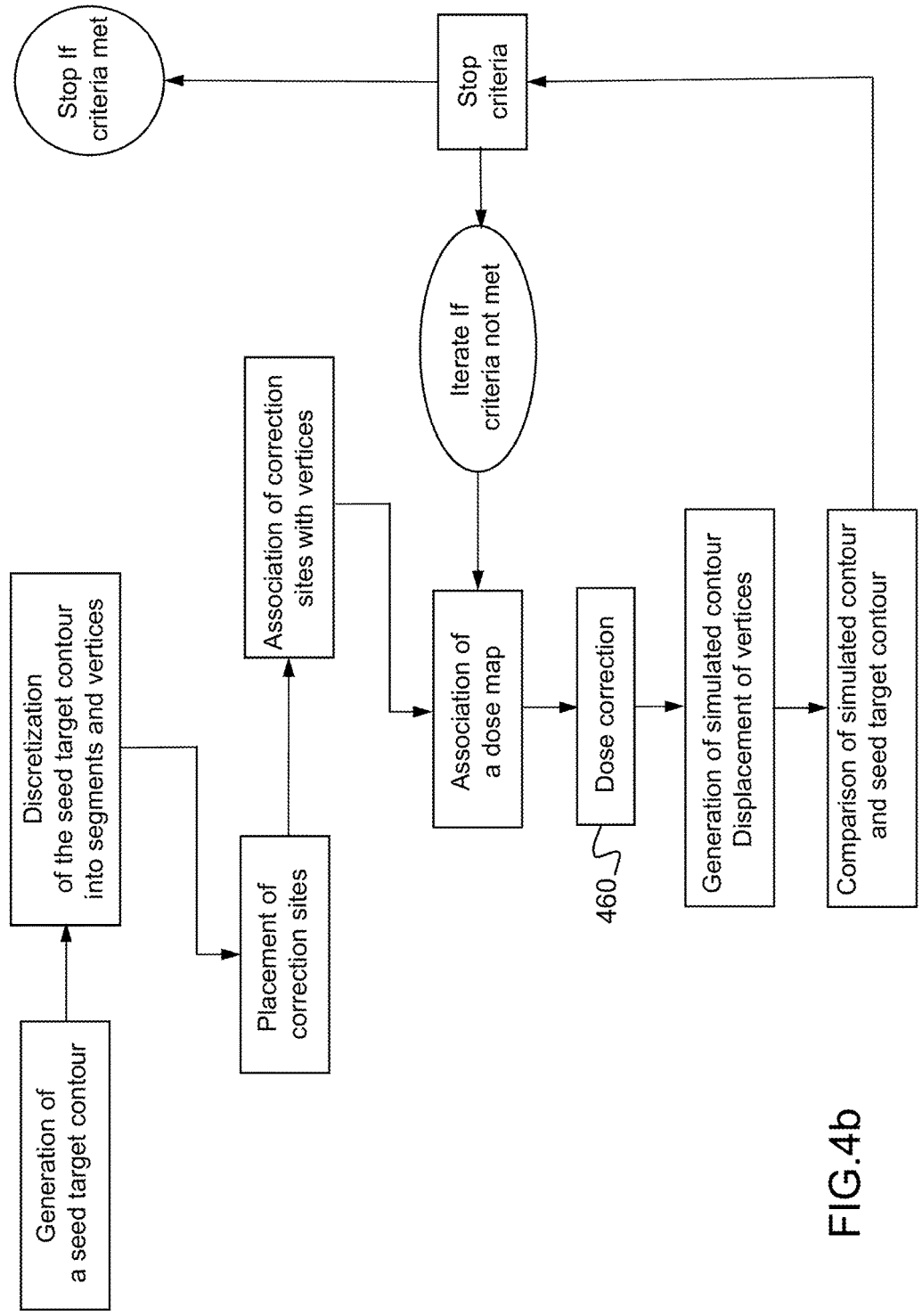

FIGS. 4a and 4b respectively represent flow charts of a vertex based correction step without and with a dose correction in a number of embodiments of the invention.

The invention can be implemented without or with dose correction, the other steps being the same.

The main steps of the method of the invention will therefore be commented from FIG. 4a.

The method is initialized with a step 410 of generating a seed target contour. The seed target contour is obtained from the target contour by filtering the target contour to eliminate the parts of the contour which would possibly introduce artefacts (for instance removing features which are pointing out of the main design, usually referred as notches, or replacing successions of tiny Manhattan steps by single non Manhattan edges). The resulting seed target contour is considered the real target to reach. In other words, the original target is considered as too fragmented.

Then, in a step 420, the seed target contour is segmented to produce enough vertices spaced regularly on the contour, but not too many. A good compromise will be with an edge length of a few α (the parameter representing the forward scattering effect of the beam in a Gaussian point spread function—or PSF—of the insulation process). Typically, "a few α" means between one and ten α.

Then, at a step 430, correction sites are placed on the segmented seed target design, and at a step 440, they are associated with neighboring vertices. Examples of how the correction sites may be placed and associated with vertices are given further down in the description in relation respectively with FIGS. 5a, 5b and 5c and FIGS. 5d, 5e and 5f.

Once the configuration of the segmented seed target design has been prepared through steps 410 to 440, the process enters an iteration loop at step 450, where an association of the design with a dose map is performed. The dose map is generally in the form of a zoning of the design with ratios of dose to resist threshold. The dose map may stay constant during the geometry correction or vary as in the example represented on FIG. 4b.

According to the method of the invention, the vertices are displaced at a step 470 using displacement vectors. The direction of the vector may be set using different rules, as explained further down in the description in relation with FIGS. 5g and 5h. The amplitude of the displacement or shift at a definite correction site is set based on the result of the simulation of the output after shift and the sequence of results of simulation of the output after the previous shifts in the loop of iterations.

The relation between simulations and shifts is a complex problem of control system engineering. A first option is to have a shift proportional to the difference between the simulation value and the desired simulation value multiplied by coefficient, which may be constant or variable. This very simple control loop can be improved for a faster convergence or a better stability, using strategies which are known from automation theory.

After the step of displacement of the vertices, the simulated contour is compared with the segmented target design at a step 480. This comparison will be based on the surfaces of the two designs, the minimum or the maximum distance between the two contours, a roughness of the simulated contour, or a combination thereof. Then a quantitative stop criteria is evaluated at step 490. The stop criteria may also include a stop based on a number of iterations or a maximum computation time, to take into account situations when the process does not converge quickly enough.

The only difference between the flow chart of FIG. 4b and the one of FIG. 4a is that the former includes a dose correction step 460 between the entry point of the iteration command or the step of associating a dose map, 450, and the implementation of the displacement of the vertices, 470.

Dose correction is applied on sub-parts of the segmented seed target contour. The dose correction which is applied is a long range correction, long range meaning in the range of the back-scattering effect, which is modeled using the β parameter in the PSF. The sub-parts of the contour are selected to be of a length around β Doses are attributed at each sub-part (typically a ratio of 1 the resist threshold at the initialization of the process). The dose correction is calculated, for instance using the method disclosed in European patent application published under n°EP2559054 which is licensed to the applicant of the present application. The dose correction is deducted from the geometry correction using the energy latitude of the process.

Dose value can be kept constant during the geometry correction or replayed at each iteration.

FIGS. 5a, 5b, 5c, 5d, 5g, 5e, 5f and 5g illustrate examples of rules applied to determine the correction site placement and association with the vertices in a number of embodiments of the invention.

Figure 5A:
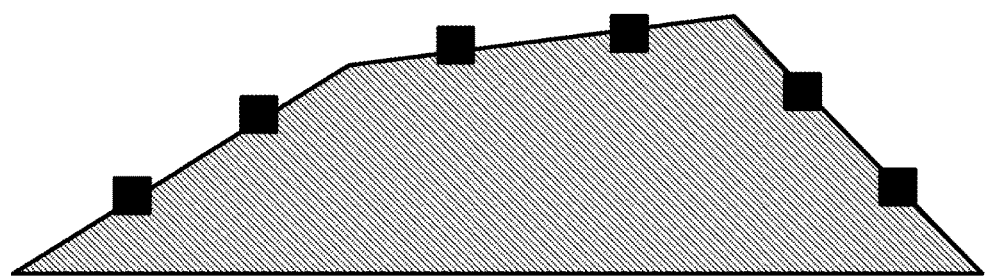
Figure 5B:
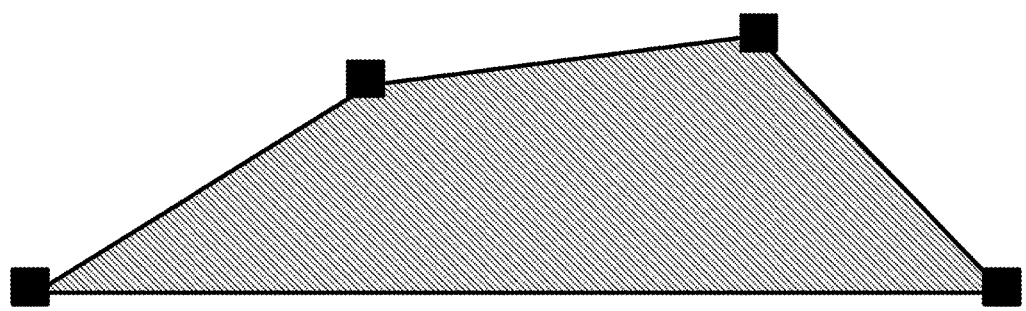
Figure 5C:
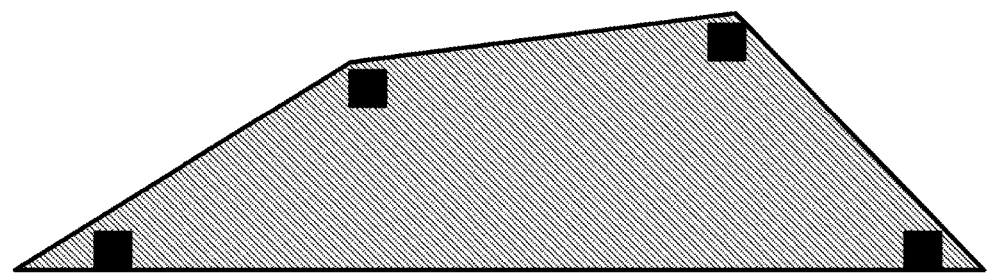

Different strategies to place the correction sites are illustrated on FIGS. 5a, 5b and 5c. Choosing the right strategy is a compromise between:
- Minimizing the number of sites to minimize the run time,
- Controlling the error on the output contour.
- Placing points where the target can be reached (corner rounding issues),
- Placing or weighting sites depending on how hard or important it is to reach the target.

In the example of FIG. 5a, the correction sites are placed on the edges away from the vertices. It may be advantageous to have more than one correction site on each edge, as illustrated on the figure with two correction sites on each edge. It is expected to control the simulation output strictly between two sites of an edge, and loosely around the vertex. The drawback is to have more than one site per vertex.

In the example of FIG. 5b, a correction site is placed on each vertex. With this strategy, we can expect a good control on the vertices but uncontrolled error in the middle of the edges.

In the example of FIG. 5c, a correction site is placed behind each vertex, inside the target contour. The goal is to place a site at a distance which takes into account the corner rounding. We can expect a better matching in the middle of the edges, even if it's not directly controlled. If the contour is convex instead of being concave, as on the figure, the correction sites will be preferably placed outside the contour, in front of the vertices.

Figure 5D:
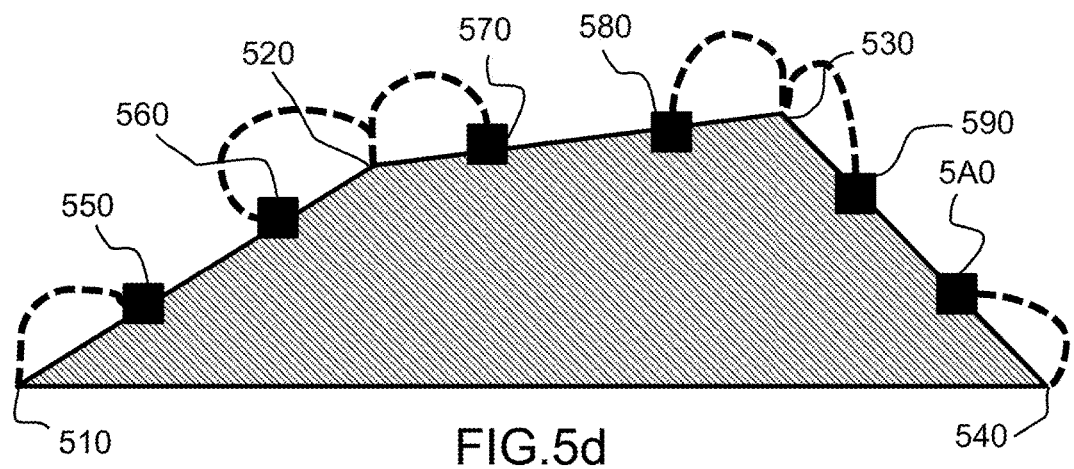
Figure 5E:
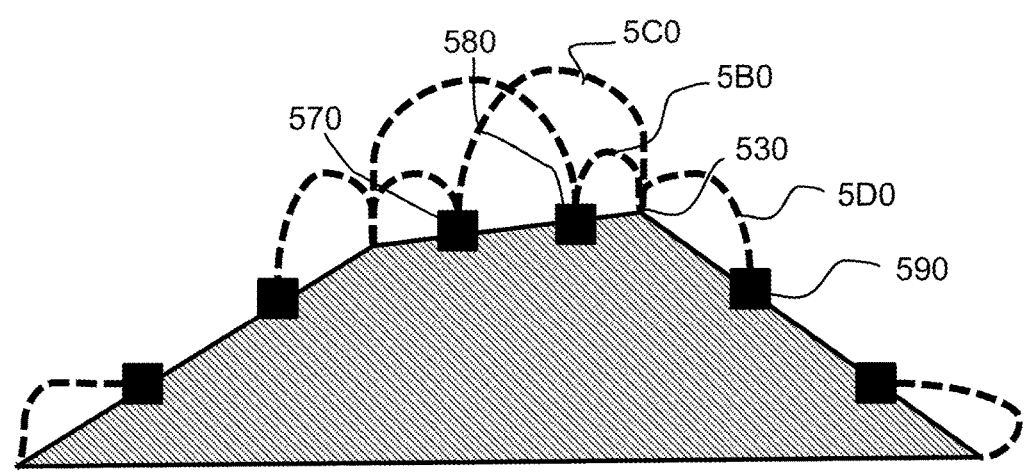
Figure 5F:
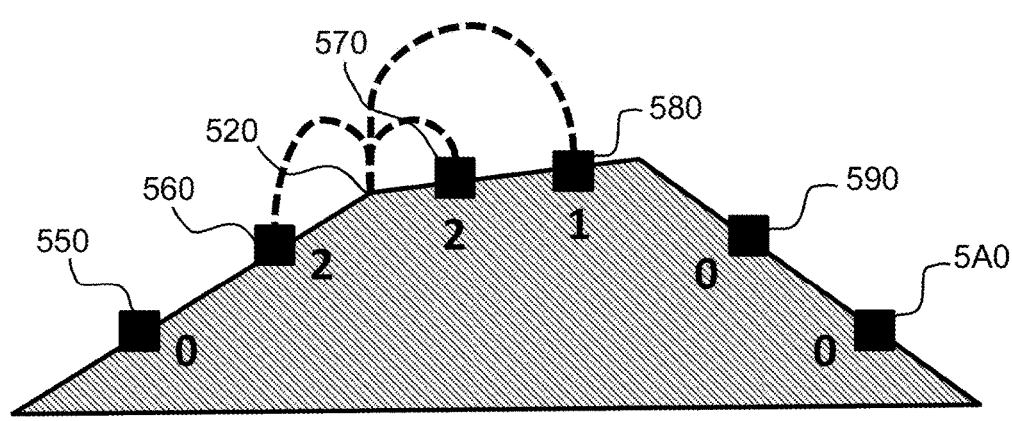

Three different rules to associate vertices and correction sites are illustrated on FIGS. 5d, 5e and 5f. If the edges are quite small (comparable to alpha or smaller), having vertices sharing the same simulation sites like in FIGS. 5e and 5f gives smoother deformations of the contour. This can be a way to improve the stability of the correction. In the example of FIG. 5d, which reproduces the configuration of FIG. 5a where there are two correction sites per edge, each vertex is associated with the closest site(s). For example, vertices 510, 540 each have only one correction site in their proximity, and these vertices are therefore simply associated with correction sites 550 and 5A0, respectively. Vertices 520, 530 each have two correction sites which are located at an equal distance, 560, 570 for the former and 580, 590 for the latter. Therefore, these sites are considered to be the closest and vertices 520, 530 are each associated with these pairs of corrections sites.

In the example of FIG. 5e, the rule is to associate to one vertex all correction sites which are within a defined distance of the vertex. For instance, vertex 530 is associated with correction sites 5B0, 5C0 and 5D0. Having more than one correction site associated to a vertex may improves precision in some cases. When using an embodiment of this type of the invention, it will be necessary to define a rule to combine the values of the shifts obtained for each correction site. A simple rule may be to take the average, but other rules may be used.

The association of a vertex with correction sites can also use a weight parameter which depends on the distance of the correction site to the vertex, as illustrated on FIG. 5f. The weight parameter will be higher for correction sites which are closer to the vertex. In the example of the figure, for vertex 520, correction sites 550, 590 and 5A0, which are the furthest, will be allocated a weight parameter of zero, whereas correction site 580, which is closer, will be allocated a weight parameter of 1, and correction sites 560 and 570, which are the closest, will be allocated a weight parameter of 2. Of course, these examples of weight parameters can be varied to fit the context of use. A typical weighting rule will be: weight=|Dmax−D|/Dmax where D is the distance between the vertex and the site, and Dmax the maximum distance to associate a vertex to the site. The larger the distance, the lower the impact of the correction site on the shift.

Two different rules to determine the direction of the displacement vector are illustrated on FIGS. 5g and 5h.

In the example of FIG. 5g, displacement vector 521 of vertex 520 has a direction which bisects the angle of the two edges 522, 523 joining at the vertex. This method is the fastest because chosing the direction is a very simple calculation.

In the example of FIG. 5h, curves 524, 525 represent the beam dose gradient. The direction of the displacement vector is determined to be along the gradient of curves 524, 525. It takes more time because this method requires at least three simulations around each vertex. The trade-off is a better stability of the correction.

It is also possible to determine the direction of the displacement vector by calculating independently a motion along the X axis and a motion along the Y axis to obtain a better fit between the simulated contour and the target contour. In certain cases, increasing the number of degrees of freedom can improve the precision of the correction.

In general, the displacement vectors of the vertices are calculated so as to minimize the difference between the simulated contour and the seed contour and, if possible, the number of iterations which is necessary to obtain the best fit.

In all embodiments, variants can be introduced to increase precision and stability of the iterations. For instance, the fit between the simulated and the target contour can be calculated on a number of edges instead of a single edge. We can decide the next shift to apply to all corresponding vertices with a multivariable algorithm. It is expected to be necessary when the vertices are close to each other (lower than a few alpha). Also, it may be beneficial to average the displacements on a number of edges, which should improve roughness.

The method of the invention can be implemented using for example a modified version of the Inscale™ software which is developed and marketed by the applicant of the current application. The software can be used to generate a data file to drive an e-beam equipment for insulating wafers or masks. Similar software can be used to generate data to drive an optical equipment with the same use. The software can also be used to generate simulation data.

The invention allows a good compromise between precision and shot count, specifically for free form designs. It is notably advantageous because it can be used for generating corrections before fracturation, which is less computer intensive than corrections applied to the shots generation at the fracturation step, which was the state of the art before edge based correction.

The examples disclosed in this specification are only illustrative of some embodiments of the invention. They do not in any manner limit the scope of said invention which is defined by the appended claims.

The invention claimed is:

1. A method of generating, with a computer, a data preparation file for use in an e-beam equipment for fracturing of a target design for insulating a semiconductor integrated circuit, said method comprising:
   a) generating a seed design from the target design;

b) generating segments connecting vertices of the seed design to form a contour of the seed design;
c) placing a number of correction sites on the contour of the seed design;
d) associating the correction sites and the vertices;
e) generating a simulated contour of the seed design at the correction sites to form a simulated design;
f) associating a dose map with the simulated design, dose being a radiation dose assigned for insulating the semiconductor integrated circuit according to the target design;
g) calculating a displacement of at least part of the vertices to improve a matching criteria between the simulated contour and the contour of the seed design;
h) generating said displacement;
i) storing the simulated contour in the data preparation file for fracturing of the target design for insulating the semiconductor integrated circuit;
j) redoing steps e) through i) until a stop criteria is met.

2. The method of claim 1, wherein the segments are defined to have a length comprised between a minimum value and a maximum value.

3. The method of claim 2, wherein the minimum value is higher than or equal to the value of a forward scattering parameter of the insulating process.

4. The method of claim 2, wherein the maximum value is lower than or equal to the value of a backward scattering parameter of the insulating process.

5. The method of claim 1, wherein the correction sites are placed based on a placement rule selected from a group comprising placing correction sites on selected edges of the simulated contour, placing correction sites at selected vertices and placing correction sites one of behind and in front of selected vertices.

6. The method of claim 1, wherein the groups of vertices are associated with correction sites based on an association rule selected from a group comprising associating a group of vertices with a closest correction site, associating a group of vertices with a correction site within a predefined distance, associating a group of vertices with a correction site within a predefined weighted distance calculated with a weight depending on a distance between vertex and correction site.

7. The method of claim 1, wherein displacing vertices is determined based on a displacement rule selected in a group comprising displacing a vertex along a bisector of an angle between two segments apart the vertex and displacing a vertex along a dose gradient at the vertex.

8. The method of claim 1, wherein displacing vertices is determined based on a difference between the simulated design and the target design at the correction sites.

9. The method of claim 1, wherein associating a dose map to the simulated design comprises determining dose corrections to update the dose map at each iteration.

10. The method of claim 9, wherein the dose corrections are long range.

11. The method of claim 1, further comprising, after step j), k) Manhattanizing the simulated design.

12. The method of claim 1, further comprising, after one of steps j) and k), l) performing an edge based correction.

13. The method of claim 1, further comprising, after one of steps j), k), and l), m) performing a fracturing of the output contour.

14. The method of claim 1, further comprising, after one of steps j), k), l) and m), n) performing a combined dose and geometry correction.

15. A computer program for generating a data preparation file for use in an e-beam equipment for fracturing of a target design for insulating a semiconductor integrated circuit, said computer program comprising user interfaces, computer code instructions and access to computer and memory resources configured for:
a) generating a seed design from the target design;
b) generating rectilinear segments connecting vertices of the seed design to form a contour of the seed design;
c) placing a number of correction sites on the contour of the seed design;
d) associating the correction sites and the vertices;
e) generating a simulated contour of the seed design at the correction sites to form a simulated design;
f) associating a dose map with the simulated design, dose being a radiation dose assigned for insulating the semiconductor integrated circuit according to the target design;
g) calculating a displacement of at least part of the vertices to improve a matching criteria between the simulated contour and the contour of the seed design;
h) generating said displacement;
i) storing the simulated contour in the data preparation file for fracturing of the target design for insulating the semiconductor integrated circuit;
j) redoing steps e) through i) until a stop criteria is met.

* * * * *